(12) United States Patent
Lee et al.

(10) Patent No.: US 9,856,388 B2
(45) Date of Patent: Jan. 2, 2018

(54) TITANIUM DIOXIDE NANO PARTICLE MODIFIED BY SURFACE STABILIZER, TITANIUM DIOXIDE NANO INK COMPRISING THE SAME, SOLAR CELL EMPLOYING THE SAME, AND PRODUCING METHOD OF THE SAME

(71) Applicant: Hyundai Motor Company, Seoul (KR)

(72) Inventors: Ki Chun Lee, Seoul (KR); Yong Jun Jang, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/520,833

(22) Filed: Oct. 22, 2014

(65) Prior Publication Data

US 2015/0056745 A1   Feb. 26, 2015

Related U.S. Application Data

(62) Division of application No. 12/831,542, filed on Jul. 7, 2010, now Pat. No. 8,894,890.

(30) Foreign Application Priority Data

Mar. 18, 2010 (KR) .................. 10-2010-0024306

(51) Int. Cl.
*C09D 11/52* (2014.01)
*C09D 11/037* (2014.01)
(Continued)

(52) U.S. Cl.
CPC ............ *C09D 17/008* (2013.01); *B82Y 30/00* (2013.01); *C09C 1/3669* (2013.01);
(Continued)

(58) Field of Classification Search
None
See application file for complete search history.

(56) References Cited

U.S. PATENT DOCUMENTS 6,329,058 B1 * 12/2001 Arney .................. C09C 1/3684
427/220
7,125,536 B2 * 10/2006 Fu ............................ B01J 21/06
423/21.1
(Continued)

FOREIGN PATENT DOCUMENTS

IT   WO 2009101640 A1 * 8/2009 ............ B82Y 30/00
KR   10-0656365   12/2006
(Continued)

OTHER PUBLICATIONS

Ramakrishna, G. et al., "Optical and Photochemical Properties of Sodium Dodecylbenzenesulfonate (DBS)-Capped $TiO_2$ Nanoparticles Dispersed in Nonaqueous Solvents," Langmuir, vol. 19, No. 3, 2003, pp. 505-508.
(Continued)

*Primary Examiner* — Katie L Hammer
(74) *Attorney, Agent, or Firm* — Mintz Levin Cohn Ferris Glovsky and Popeo, P.C.; Peter F. Corless

(57) ABSTRACT

Disclosed are a titanium dioxide nano ink having such a strong dispersibility as to be applicable by inkjet printing and having adequate viscosity without requiring printing several times, and a titanium dioxide nano particle modified by a surface stabilizer included therein. Inkjet printing of the titanium dioxide nano ink enables printing of a minute electrode. In addition, efficiency of a solar cell may be maximized since occurrence of pattern cracking is minimized.

4 Claims, 1 Drawing Sheet

(51) Int. Cl.
  H01L 31/0224  (2006.01)
  C09D 17/00    (2006.01)
  C09D 11/322   (2014.01)
  B82Y 30/00    (2011.01)
  C09C 1/36     (2006.01)
  H01M 4/04     (2006.01)
  H01M 14/00    (2006.01)

(52) U.S. Cl.
  CPC .......... *C09D 11/037* (2013.01); *C09D 11/322* (2013.01); *C09D 11/52* (2013.01); *H01L 31/022425* (2013.01); *H01M 4/0404* (2013.01); *H01M 4/0414* (2013.01); *H01M 14/005* (2013.01); *C01P 2004/64* (2013.01); *Y02E 10/542* (2013.01); *Y02P 70/521* (2015.11); *Y10S 977/773* (2013.01); *Y10T 428/24802* (2015.01)

(56) References Cited

U.S. PATENT DOCUMENTS

| | | | |
|---|---|---|---|
| 7,785,496 B1* | 8/2010 | Shim | C09D 5/24 106/31.58 |
| 2003/0089271 A1 | 5/2003 | Hirano et al. | |
| 2006/0104894 A1* | 5/2006 | Daoud | C01G 23/053 423/610 |
| 2009/0247652 A1* | 10/2009 | Silverman | B01J 13/0047 516/33 |
| 2009/0258145 A1 | 10/2009 | Mukae et al. | |
| 2009/0297626 A1* | 12/2009 | O'Brien | A61K 33/24 424/642 |
| 2010/0117503 A1* | 5/2010 | Mizuno | B82Y 30/00 313/110 |
| 2012/0111409 A1* | 5/2012 | Kim | B82Y 30/00 136/263 |
| 2012/0275119 A1* | 11/2012 | Allen | B82Y 30/00 361/728 |

FOREIGN PATENT DOCUMENTS

| | | |
|---|---|---|
| KR | 10-2007-0048996 | 5/2007 |
| KR | 10-0786868 | 5/2007 |
| KR | 10-0783766 | 12/2007 |
| KR | 10-2008-0001654 A | 1/2008 |
| KR | 10-0836659 | 1/2008 |
| KR | 10-0830871 | 4/2008 |
| KR | 10-2009-0019781 | 2/2009 |
| WO | 2008074869 A1 | 6/2008 |

OTHER PUBLICATIONS

Hester, (2007). Nanotechnology—Consequences for Human Health and the Environment. (pp. 1-18, section titled "Current and Future Applications of Nanotechnology" written by Barry Patk). Royal Society of Chemistry. Online version available at : http://app.knovel.com/hotlink/toc/id:kpNCHHE001/nanotechnology-consequences.

* cited by examiner

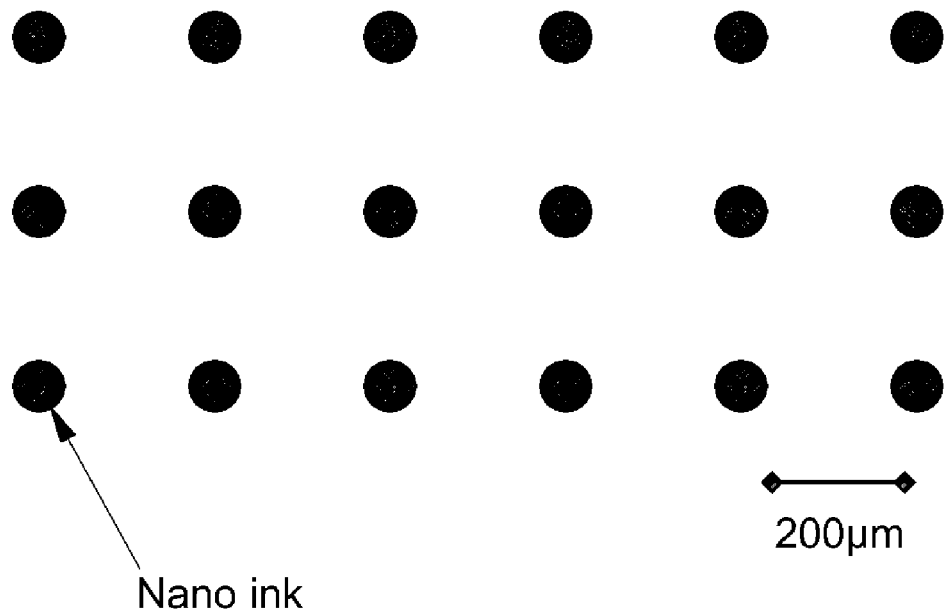

TITANIUM DIOXIDE NANO PARTICLE MODIFIED BY SURFACE STABILIZER, TITANIUM DIOXIDE NANO INK COMPRISING THE SAME, SOLAR CELL EMPLOYING THE SAME, AND PRODUCING METHOD OF THE SAME

CROSS-REFERENCE(S) TO RELATED APPLICATIONS

The present application is a Divisional Application of U.S. patent application Ser. No. 12/831,542, filed Jul. 7, 2010, which claims priority of Korean Patent Application No. 10-2010-0024306, filed on Mar. 18, 2010, which are incorporated herein by reference.

BACKGROUND

Technical Field

The present disclosure relates to a nano particle used to coat an electrode of a dye-sensitized solar cell.

Description of Related Art

With the recent growing concerns on the global warming, development of technologies utilizing environment-friendly energy has been drawing much of public attentions. Solar cell, being one of the most intriguing energy sources as such, study on this field has been diversified including silicon-based solar cells, thin film solar cells using inorganic materials such as copper indium gallium selenide ($Cu(InGa)Se_2$; CIGS), dye-sensitized solar cells, organic solar cells, and organic-inorganic hybrid solar cells. Of them, the dye-sensitized solar cell, which is inexpensive and being drawn close to commercial application, has been highlighted in the fields of building-integrated photovoltaics (BIPV) and portable electronics.

Unlike other solar cells, the dye-sensitized solar cell absorbs visible light and produces electricity through a photoelectric conversion mechanism. In general, patterning of the titanium dioxide working electrode used in the dye-sensitized solar cell is prepared by a screen printing process. Screen printing is a printing technique in which a screen is placed on a work table and a paste is applied on a substrate as it is being passed through a patterned mesh using a rubber blade called the squeegee. The screen printing process is, however, disadvantageous in that it requires a great amount of expensive paste and it is applicable only to a flat substrate. Especially, the control of pattern intervals is important since the efficiency of the solar cell increases in proportion to the light receiving area. The limitation in the control of linewidth between electrodes has been pointed out as the shortcoming of the screen printing technique.

Recently, there has been proposed to form electrode by inkjet printing. This method has advantages that it reduces material loss and has secured control of narrow linewidths and its process is simple. The inkjet-based patterning process looks promising as a direct printing technique applicable not only to flat-panel displays but also to solar cells and other applications.

The inkjet process is advantageous in that, since a wanted pattern can be directly formed on a substrate using an inkjet head having small nozzles, the number of processes and material consumption decrease as compared to the screen printing technique and a desired pattern can be created using a simple computer software. However, because a highly viscous paste cannot be used in the inkjet method, printing has to be performed several times to accomplish an electrode coating with a predetermined thickness.

The above information disclosed in this Background section is only for enhancement of understanding of the background of the invention and therefore it may contain information that does not form the prior art that is already known in this country to a person of ordinary skill in the art.

SUMMARY

The present invention relates to a titanium dioxide nano particle modified by a surface stabilizer, a nano ink comprising the same, and a dye-sensitized solar cell produced using the same.

An object of the present invention is to make ink-jetting in an inkjet printing procedure easy by capping the surface of a titanium dioxide nano particle with a surface stabilizer.

Another object of the present invention is to provide a titanium dioxide nano ink comprising the titanium dioxide nano particle modified by a surface stabilizer, as well as additives such as an interfacial dispersant and a solvent, a substrate patterned using the titanium dioxide nano ink, and a dye-sensitized solar cell produced using the titanium dioxide nano ink.

The present invention provides a titanium dioxide nano particle coated with a surface stabilizer by chemical bonding so as to provide good compatibility with an ink composition, and a method for preparing the same. The surface stabilizer may be represented by any one of Chemical Formulae 1 to 3. The surface stabilizer has an acid functional group and also has a hydrophobic moiety capable of providing stable dispersion in other materials.

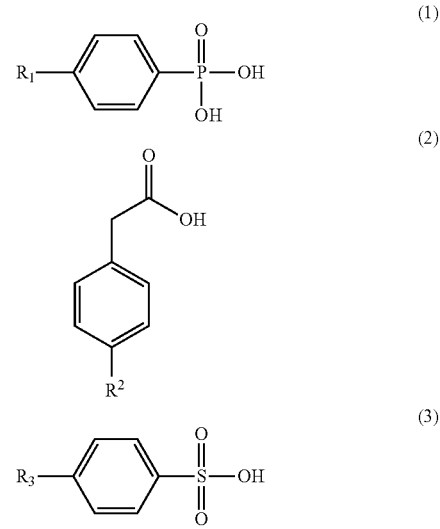

In Chemical Formulae 1 to 3, $R_1$, $R_2$ and $R_3$ independently represent hydrogen, $C_1$-$C_{20}$ alkyl, $C_2$-$C_{20}$ alkenyl, $C_2$-$C_{20}$ alkynyl or $C_6$-$C_{30}$ aryl.

The present invention also provides a nano ink comprising the titanium dioxide nano particle capped with the surface stabilizer, a dispersant and a solvent.

The present invention further provides a substrate coated with the nano ink by inkjet printing, and a solar cell with an electrode layer printed using the nano ink. The substrate or the electrode is free from the clogging problem because of minimized cohesion and minimized surface tension on the nozzle, conferred by the surface stabilizer capped on the nano particle surface. Unlike the titanium dioxide thin film prepared by screen printing process, pattern cracking during sintering may be minimized because the particles are uniformly distributed, which leads to maximized diffusion and transition of electrons and improved efficiency of a solar cell. Further, it is advantageous in that it is applicable to a curved substrate since the inkjet process can be used.

The titanium dioxide nano particle of the present invention resolves the clogging problem since the capped surface stabilizer minimizes cohesion and minimized surface tension on the nozzle. The nano ink comprising the titanium dioxide nano particle of the present invention may improve efficiency of a solar cell since occurrence of pattern cracking during sintering is minimized and diffusion and transition of electrons produced by a photoelectric conversion are maximized. Further, it is applicable to a curved substrate since the inkjet process can be employed.

BRIEF DESCRIPTION OF THE DRAWING

The above and other objects, features and advantages of the present invention will become apparent from the following description of preferred embodiments given in conjunction with the accompanying drawing, in which:

FIG. 1 shows a image of a nano ink comprising the titanium dioxide prepared in accordance with the present invention printed by ink-jetting.

DETAILED DESCRIPTION

The advantages, features and aspects of the invention will become apparent from the following description of the embodiments with reference to the accompanying drawings, which is set forth hereinafter.

The present invention provides a titanium dioxide nano particle coated with a surface stabilizer by chemical bonding so as to provide good compatibility with an ink composition. The surface stabilizer may be represented by any one of Chemical Formulae 1 to 3. The surface stabilizer has an acid functional group and also has a hydrophobic moiety capable of providing stable dispersion in other materials.

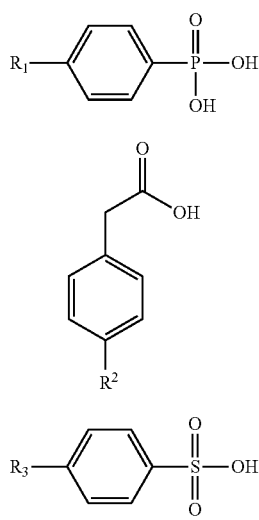

In Chemical Formulae 1 to 3, $R_1$, $R_2$ and $R_3$ independently represent hydrogen, $C_1$-$C_{20}$ alkyl, $C_2$-$C_{20}$ alkenyl, $C_2$-$C_{20}$ alkynyl or $C_6$-$C_{30}$ aryl.

The titanium dioxide nano particle capped with the surface stabilizer may be obtained by reacting the surface stabilizer with titanium isopropoxide, a precursor used to prepare a titanium dioxide nano particle. The solvent may be an alcohol, glycol, polyol, glycol ether, or the like. More specifically, methanol, ethanol, propanol, isopropanol, butanol, pentanol, haxanol, dimethyl sulfoxide (DMSO), dimethylformamide (DMF), glycerol, ethylene glycol, ethylene glycol monomethyl ether, ethylene glycol monoethyl ether, ethylene glycol dimethyl ether, ethylene glycol diethyl ether, propylene glycol, propylene glycol propyl ether, etc., may be used alone or in combination of two or more thereof. The proportion of the titanium isopropoxide, the surface stabilizer and the solvent may be 5 to 8 vol %, 0.1 to 1 vol % and 91 to 94 vol %. Preferably, thus produced titanium dioxide colloid solution has a titanium dioxide content from 10 to 15 vol %. By evaporating the solvent from the titanium dioxide colloid solution, a titanium dioxide nano particle having a size of about from 3 to 30 nm may be obtained.

The present invention further provides a nano ink comprising the titanium dioxide nano particle capped with the surface stabilizer, a dispersant and a solvent.

The dispersant is compatible with the surface structure of the nano particle and makes the nano particle disperse well in the solvent without precipitating easily. The dispersant may be a non-ionic surfactant. More specifically, it may be a polyethylene oxide-polypropylene oxide block copolymer or a polyethylene oxide-polystyrene block copolymer represented by Chemical Formula 4 or 5.

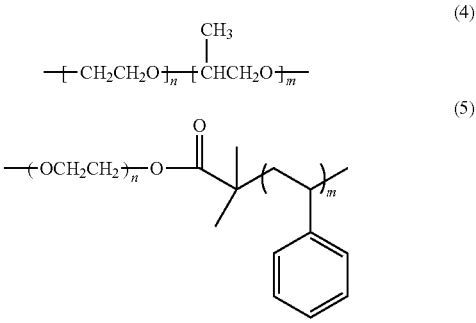

In Chemical Formulae 4 and 5, n and m independently represent an integer from 1 to 30.

The copolymer represented by Chemical Formula 4 or 5 provides improved lubrication at the interface with the titanium dioxide nano particle and thus is effective in improving dispersibility when it has a polyethylene oxide ($CH_2CH_2O$) content from 30 to 80 wt % based on the total weight of the copolymer.

The solvent for the titanium dioxide nano ink may be an alcohol, glycol, polyol, glycol ether, etc. More specifically, it may be methanol, ethanol, propanol, isopropanol, butanol, pentanol, haxanol, dimethyl sulfoxide (DMSO), dimethylformamide (DMF), glycerol, ethylene glycol, ethylene glycol monomethyl ether, ethylene glycol monoethyl ether, ethylene glycol dimethyl ether, ethylene glycol diethyl ether, propylene glycol, propylene glycol propyl ether, or a mixture thereof.

In the titanium dioxide nano ink of the present invention, the proportion of the titanium dioxide nano particle, the dispersant and the solvent may be about 10 to 70 parts by weight, about 0.1 to 10 parts by weight and about 20 to 82 parts by weight. If the content of the titanium dioxide nano particle is less than 10 parts by weight, the number of inkjet printing has to be increased. Meanwhile, if it exceeds 70 parts by weight, the ink may be inappropriate for inkjet printing because of too high viscosity. If the content of the dispersant is less than 0.1 part by weight, a desired effect may not be attained. Meanwhile, if it exceeds 10 parts by weight, the ink may be inappropriate for inkjet printing because of too high viscosity.

The titanium dioxide nano ink of the present invention may have a viscosity from about 1 to 50 cps at room temperature. If necessary, the ink of the present invention may be heated to about 80° C. or below during application to reduce viscosity. By heating to 80° C. or below, the viscosity may be reduced to about 1 to 20 cps. The nano ink of the present invention may further comprise a viscosity modifier. The viscosity modifier serves to modify the viscosity of the nano ink to be appropriate for printing.

The present invention further provides a solar cell with an electrode layer printed using the titanium dioxide nano ink. After applying the titanium dioxide nano ink on a substrate, the substrate may be sintered to form an electrode pattern. The electrode pattern may be formed by inkjet printing. The inkjet printing method is advantageous in less material loss, easier control of narrow linewidths, a simpler process, or the like. Non-limiting examples of the substrate include a glass substrate, a transparent polymer substrate and a flexible substrate. The sintering may be performed at about 300 to 500° C. for several minutes to several hours. During the sintering process, organic compounds included in the titanium dioxide nano ink such as the dispersant and the solvent are decomposed and destroyed, and the remaining titanium dioxide nano particles form a porous electrode.

EXAMPLES

The examples and experiments will now be described. The following examples are for illustrative purposes only and not intended to limit the scope of the present invention.

Example

Preparation of Titanium Dioxide Nano Particle and Manufacture of Solar Cell Using the Same Toluenesulfonic acid (1.72 mL) was dissolved in butanol (25 mL). After mixing butanol (150 mL) with Millipore water (5 mL) and adding titanium isopropoxide (12 mL), the resultant mixture was added to the toluenesulfonic acid solution. The mixture was reacted at room temperature for 1 hour and then at 110° C. for 6 hours. The reaction was proceeded further by adding phenylsulfonic acid.

The solvent was evaporated from the resultant titanium dioxide colloid solution to adjust the volume to about 120 mL.

Polyethylene oxide-polypropylene oxide copolymer (40:60, based on weight, 10 g) was added to the solution and then mixed. 1 hour later, the solution was treated with a tip-type sonicator for 10 minutes. FIG. 1 shows an image of thus prepared titanium dioxide nano ink printed by inkjetting. It can be seen that the titanium dioxide nano particles are dispersed well with an interval of 200 μm.

The prepared nano ink was injected into a printer head and an electrode was applied on a glass substrate. After heating at 300° C. for 1 hour, the substrate was sintered at 500° C. for 3 hours. After adsorbing a dye (N3, Solaronix) on thus prepared electrode for 24 hours at room temperature, it was bonded with a platinum counter electrode substrate (Surlyn, DuPont) at 120° C. After injecting an electrolyte through a previously prepared hole, a dye-sensitized solar cell was completed by blocking the injection hole with Surlyn.

Comparative Example

A dye-sensitized solar cell was prepared according to a commonly employed method. A titanium dioxide paste (Solaronix) for screen printing was coated on a fluorine-doped tin oxide (FTO)-coated glass substrate using a screen printing apparatus. After heating at 300° C. for 1 hour, the substrate was sintered at 500° C. for 3 hours. After adsorbing a dye (N3, Solaronix) on thus prepared electrode for 24 hours at room temperature, it was bonded with a platinum counter electrode substrate (Surlyn, DuPont) at 120° C. After injecting an electrolyte through a previously prepared hole, a dye-sensitized solar cell was completed by blocking the injection hole with Surlyn.

Current density ($J_{sc}$), voltage ($V_{oc}$), fill factor (FF) and energy conversion efficiency of the dye-sensitized solar cells according to the Example and Comparative Example were evaluated and compared, as summarized in Table 1. It can be seen that the present invention provides improved energy efficiency. Besides, the present invention is advantageous in that it lowers production cost due to the decreased ink consumption, has simplified process and applicability to a curved substrate.

TABLE 1

| Samples | Current density ($J_{sc}$) | Voltage ($V_{oc}$) | Fill factor (FF) | Energy conversion efficiency (%) |
| --- | --- | --- | --- | --- |
| Example | 4.09 | 0.623 | 0.679 | 1.73 |
| Comparative Example | 3.95 | 0.622 | 0.655 | 1.61 |

While the present invention has been described with respect to the specific embodiments, it will be apparent to those skilled in the art that various changes and modifications may be made without departing from the spirit and scope of the invention as defined in the following claims.

What is claimed is:

1. A method for preparing a titanium dioxide nano particle ink, comprising:
   mixing and reacting titanium isopropoxide with a surface stabilizer represented by Chemical Formula 2 in a solvent to produce a titanium colloid solution;
   evaporating the solvent from the titanium colloid solution to produce titanium oxide nanoparticles capped with the surface stabilizer, and
   adding a dispersant which is a copolymer represented by Chemical Formula 5 in an amount from 0.1 to 10 parts by weight relative to the total weight of the titanium dioxide nano particle ink to the titanium dioxide nanoparticles capped with the surface stabilizer to obtain the titanium dioxide nano particle ink,

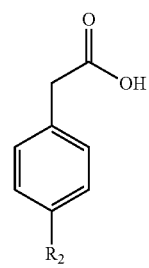

(2)

wherein $R_2$ represents hydrogen, $C_1$-$C_{20}$ alkyl, $C_2$-$C_{20}$ alkenyl, $C_2$-$C_{20}$ alkynyl or $C_6$-$C_{30}$ aryl,

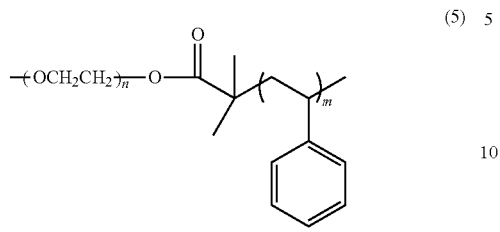

(5)

wherein n and m independently represent an integer from 1 to 30.

2. The method of claim 1, wherein the solvent is an alcohol, a glycol or a glycol ether.

3. The method of claim 2, wherein the solvent is methanol, ethanol, propanol, isopropanol, butanol, pentanol, haxanol, dimethyl sulfoxide, dimethylformamide, glycerol, ethylene glycol, ethylene glycol monomethyl ether, ethylene glycol monoethyl ether, ethylene glycol dimethyl ether, ethylene glycol diethyl ether, propylene glycol, propylene glycol propyl ether, or a mixture of thereof.

4. The method of claim 1, wherein 5 to 8 vol % of titanium isopropoxide is mixed with 0.1 to 1 vol % of the surface stabilizer and 91 to 94 vol % of the solvent.

\* \* \* \* \*